Figure 1:
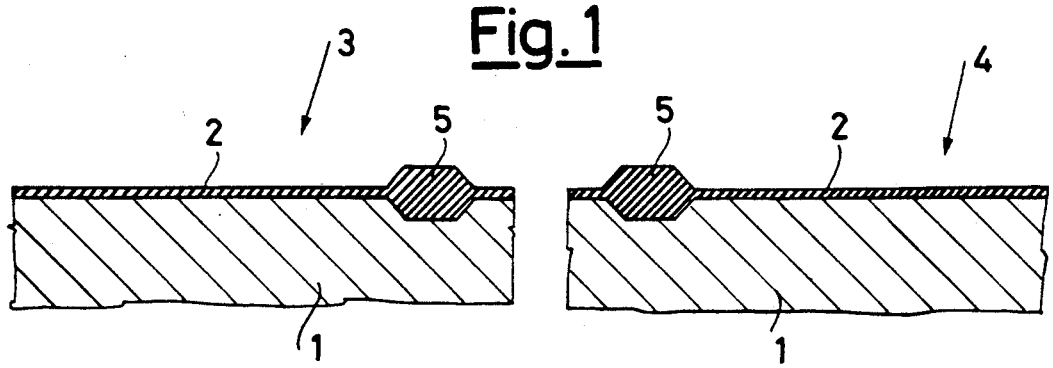

United States Patent [19]
Riva

[11] Patent Number: 5,086,008
[45] Date of Patent: Feb. 4, 1992

[54] PROCESS FOR OBTAINING HIGH-VOLTAGE N CHANNEL TRANSISTORS PARTICULARLY FOR EEPROM MEMORIES WITH CMOS TECHNOLOGY

[75] Inventor: Carlo Riva, Monza, Italy

[73] Assignee: SGS-Thomson Microelectronics s.r.l., Agrate Brianza, Italy

[21] Appl. No.: 604,995

[22] Filed: Oct. 29, 1990

Related U.S. Application Data

[63] Continuation of Ser. No. 309,889, Feb. 14, 1989, abandoned.

[30] Foreign Application Priority Data

Feb. 29, 1988 [IT] Italy ................ 19580 A/88

[51] Int. Cl.$^5$ ........................................... H01L 21/70
[52] U.S. Cl. ........................................ 437/41; 437/43; 437/44; 437/48; 437/52; 437/191
[58] Field of Search ............. 437/29, 40, 41, 43, 437/44, 48, 52, 58, 69, 191, 985; 148/DIG. 116, DIG. 163; 351/23.6

[56] References Cited

U.S. PATENT DOCUMENTS

| | | | |
|---|---|---|---|
| 3,434,021 | 3/1969 | Hofstein | 148/DIG. 116 |
| 3,909,306 | 9/1975 | Sakamoto et al. | 437/27 |
| 4,373,249 | 2/1983 | Kosa et al. | 437/52 |
| 4,505,027 | 3/1985 | Schwabe et al. | 437/41 |
| 4,530,150 | 7/1985 | Shirato | 437/29 |
| 4,575,920 | 3/1986 | Tsunashima | 437/29 |
| 4,642,881 | 2/1987 | Matsukawa et al. | 437/43 |
| 4,651,406 | 3/1987 | Shimizu et al. | 437/52 |
| 4,663,645 | 5/1987 | Komori et al. | 357/23.5 |
| 4,701,776 | 10/1987 | Perlegeos et al. | 357/23.5 |
| 4,717,684 | 1/1988 | Katto et al. | 437/40 |

FOREIGN PATENT DOCUMENTS

| | | | |
|---|---|---|---|
| 0064069 | 4/1983 | Japan | 437/52 |
| 0025458 | 2/1987 | Japan | 437/52 |

OTHER PUBLICATIONS

Ho et al., "Si/S102 Interface Oxidation Kinetics: A Physical Model for the Influence of High Substrate Doping Levels", J. of Electrochemical Society, Sep. 1979, pp. 1516-1530.

Deal et al., "Thermal Oxidation of Heavily Doped Silicon", J. Electrochemical Soc., Apr. 65, pp. 430-435.

Primary Examiner—Brian E. Hearn
Assistant Examiner—Tom Thomas
Attorney, Agent, or Firm—Sixbey, Friedman, Leedom & Ferguson

[57] ABSTRACT

The process call for N$^-$ doping of a predetermined portion of a type-P semiconductor substrate preceding deposit and definition of a layer of gate polysilicon on a part of said predetermined portion and on an adjacent portion of substrate. After oxidation of the polysilicon there is performed an N$^+$ doping in the remaining part of said predetermined portion of the substrate and of an additional substrate portion located on the opposite side of the gate.

3 Claims, 2 Drawing Sheets

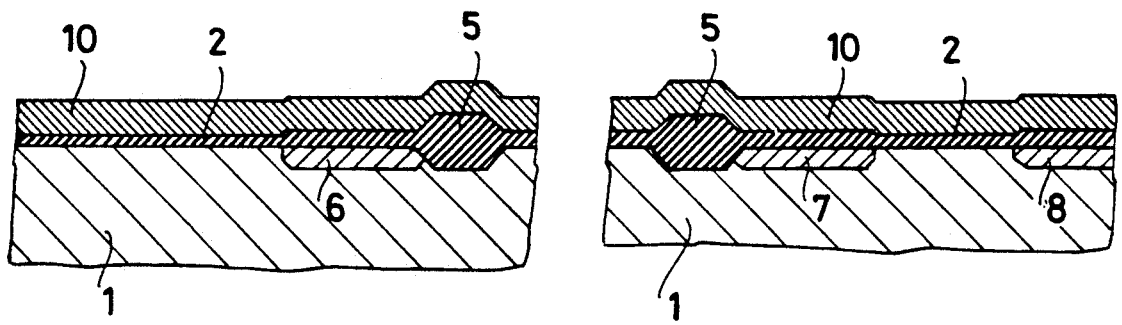
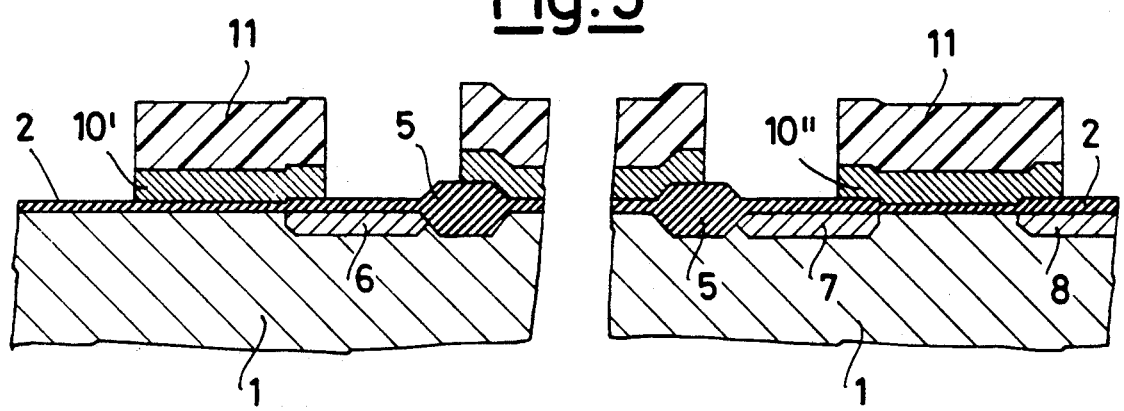
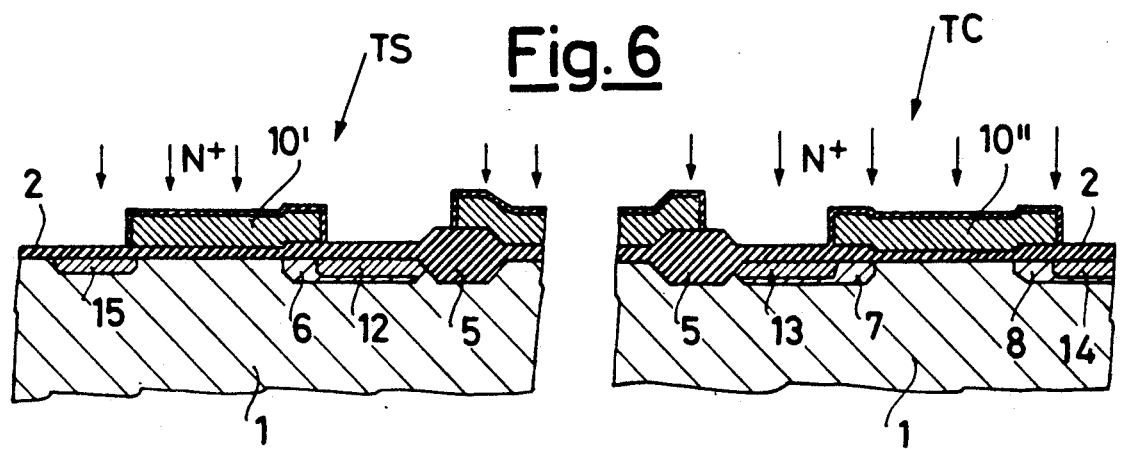

PROCESS FOR OBTAINING HIGH-VOLTAGE N CHANNEL TRANSISTORS PARTICULARLY FOR EEPROM MEMORIES WITH CMOS TECHNOLOGY

This application is a continuation of Ser. No. 07/309,889, filed 2/14/89 now abandoned.

DESCRIPTION

The present invention relates to a process for obtaining high-voltage N channel transistors particularly for EEPROM memories with CMOS technology.

Various processes for obtaining high-voltage N channel transistors are known and can be found in the literature. One of these which is used particularly for selection and external circuitry transistors in EEPROM memories with CMOS technology calls for in succession deposit and definition of a layer of polysilicon on a semiconductor substrate covered with gate oxide for the formation of a gate area, N+ doping of a first predetermined portion of the substrate on one side of said gate area for the formation of a source area and of a second predetermined portion of the substrate on the other side of said gate area and spaced therefrom for the formation of a drain area and finally the N− doping of an intermediate portion of the substrate between said gate area and said drain area for the formation of an extension of the drain area with lower N doping.

In this manner the drain junction near the gate has low-concentration doping which permits limiting the electric field in that zone between gate and diffusion and consequently amplification of the working voltage field which the transistor is able to accept without breaking the gate oxide between the drain and the gate.

In a quite similar manner, starting from N substrates and performing P doping instead of N doping it is possibile to use the same process to obtain high voltage P channel transistors.

This known process has the shortcoming of not being usable to obtain high-voltage N channel transistors together with high-voltage P channel transistors as required for EEPROM memories with CMOS technology except by the use of an additional mask or with circuital complications and the resulting added cost.

The object of the present invention is to accomplish a process for obtaining high voltage N channel transistors which would be usable in place of the known process mentioned above to obtain the N channel transistors of an EEPROM memory with CMOS technology while the P channel transistors of said memory are still obtained by the known process without requiring the use of additional masks.

In accordance with the invention said object is achieved by a process for obtaining high-voltage N channel transistors characterized in that it comprises in succession the steps (a) the N− doping of at least one predetermined portion of a type-P semiconductor substrate covered with gate oxide, (b) deposit and definition of an appropriately N+ doped polysilicon layer on a part of said predetermined portion and on an adjacent portion of the substrate for formation of a gate area, (c) oxidation of the polysicon and (d) N+ doping of the remaining part of said predetermined portion of the substrate for formation of a drain area partly N− doped under the gate area and another portion of the substrate on the side opposite said gate area for formation of a source area.

By this process, which is usable simultaneously for the high-voltage selection transistors and the external circuitry transistors of an EEPROM memory, there are obtained transistors with the desired low-concentration drain doping under the gate so as to limit the electric field in that zone.

At the same time this process may be used for high-voltage N channel transistors while the known process continues to be used for the P channel transistors with no requirement for additional masks.

Application of the process in accordance with the invention to provide an example of the accomplishment of a selection transistor and an external circuitry transistor, both high-voltage N channel, for an EEPROM memory with CMOS technology will now be described in detail for greater clarity with reference to the N channel part and the annexed drawings wherein;

FIGS. 1-6 show in succession the main steps of said process.

FIG. 1 shows a P-type semiconductor substrate 1 covered by a layer of oxide 2 provided on the active areas 3 and 4 defined between field oxide zones 5. The area 3 is designed for formation of a selection transistor for an EEPROM cell while the area 4 is designed for formation of a high-voltage external circuitry transistor.

Figure 2:
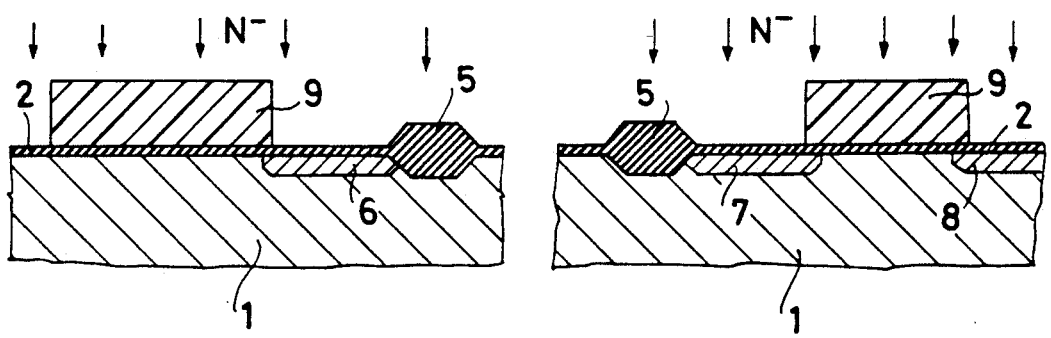

As shown in FIG. 2 a predetermined portion 6 of the substrate in the area of the selection transistor and two predetermined spaced portions 7 and 8 of said substrate are subjected to N doping (e.g. phosphorous with doses between $10^{13}$ and $10^{14}$ atoms of phosphorous/$cm^2$) using a resist mask 9 to protect the portions which are not to receive the dope.

Figure 3:
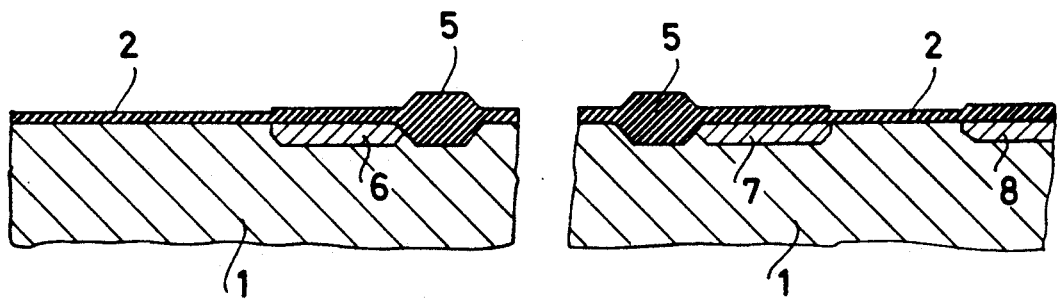

The resist is then removed and the entire surface is oxidized. In a known manner the oxide grows more on the portions previously doped (FIG. 3).

The following step calls for deposit of a layer of polysilicon 10 which is then N+ doped (FIG. 4).

Another resist mask 11 subsequently allows definition of the polysilicon 10 in the form of two strips 10′ and 10″ of which the first is superimposed on a part of the portion of substrate 6 with N− doping and an adjacent undoped portion of said substrate and the second is superimposed on a part of each portion of substrate 7 and 8 with N− doping and on the interposed undoped portion of said substrate (FIG. 5). The two strips of polysilicon 10′ and 10″ are designed to form the gates of the two transistors being produced.

After removal of the resist and a subsequent oxidation there is performed N+ doping of the remaining parts 12, 13, 14, 15 of the portions of substrate 6, 7, 8 and of another portion of substrate 15 located on the side of the gate 10′ opposite the portion 6 (FIG. 6). The portions 15 and 13 thus become the N+ source areas of the selection and external circuitry transistors respectively while the portions 12 and 14 become the N+ drain areas of said transistors, having respective portions with N− doping 6 and 8 under the gates 10′ and 10″.

There are thus obtained a selection transistor TS and an external circuitry transistor TC, both with high-voltage N channel (FIG. 6).

I claim:

1. Process for obtaining a high-voltage N-channel transistor, particularly for an EEPROM memory with CMOS technology, comprising in succession the steps of:
   a) N− doping at least a first portion of a P-type semiconductor substrate surface which has been covered with an oxide layer, b) oxidizing the doped first portion of the substrate surface to form a gate oxide layer which is thicker than gate oxide layer thicknesses on any other portion of the substrate surface as a result of the N− doping, c) deposite and definition of an N+ doped polysilicon layer on a part of said doped first portion and on an adjacent portion of the substrate surface to form a gate strip, d) oxidizing the gate strip, e) N+ doping the remaining part of said doped first portion of the substrate surface which does not have the N+ doped polysilicon layer deposited and defined thereon, and simultaneously N+ doping another portion of the substrate surface at a side of the gate strip opposite to that of said doped first portion to form drain and source areas.

2. Process in accordance with claim 1 characterized in that said first portion comprises a first drain portion for an EEPROM cell selection transistor and a second drain portion for a high-voltage external circuitry transistor for an EEPROM memory and said additional portion comprises a first source portion for said selection transistor and a second source portion for said circuitry transistor.

3. Process in accordance with claim 2 characterized in that said N− doping is also performed on said second source portion, part of which receives said polysilicon layer and the remaining part being subjected to said N+ doping.

* * * * *